United States Patent
Misumi et al.

(10) Patent No.: US 8,097,942 B2
(45) Date of Patent: Jan. 17, 2012

(54) SEMICONDUCTOR DEVICE INCLUDING POWER SUPPLY BAR HAVING JUTTED PORTION, PARALLEL RUNNING PORTION AND BENT PORTION AND MANUFACTURING METHOD THEREFOR

(75) Inventors: Kazuyuki Misumi, Tokyo (JP); Katsuyuki Fukudome, Tokyo (JP); Kazushi Hatauchi, Tokyo (JP); Kazuya Fukuhara, Tokyo (JP); Kunihiro Yamashita, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 220 days.

(21) Appl. No.: 12/463,850

(22) Filed: May 11, 2009

(65) Prior Publication Data

US 2010/0001386 A1    Jan. 7, 2010

(30) Foreign Application Priority Data

Jul. 1, 2008  (JP) .................................. 2008-172585

(51) Int. Cl.
*H01L 23/495*  (2006.01)
*H01L 23/52*  (2006.01)
*H01L 23/48*  (2006.01)

(52) U.S. Cl. . 257/691; 257/670; 257/692; 257/E23.079; 257/E23.153

(58) Field of Classification Search .................. 257/670, 257/691, 692, E23.079, E23.153
See application file for complete search history.

(56) References Cited

U.S. PATENT DOCUMENTS

| 6,008,073 | A | * | 12/1999 | King et al. | 438/123 |
| 6,133,623 | A | * | 10/2000 | Otsuki et al. | 257/666 |
| 2002/0014686 | A1 | * | 2/2002 | Kanemoto et al. | 257/678 |
| 2004/0256707 | A1 | * | 12/2004 | Sugimori | 257/678 |
| 2006/0186528 | A1 | * | 8/2006 | Sasaki et al. | 257/690 |
| 2007/0278633 | A1 | * | 12/2007 | Uematsu | 257/676 |

FOREIGN PATENT DOCUMENTS

JP    6-252328    9/1994

* cited by examiner

*Primary Examiner* — Minh-Loan T Tran
*Assistant Examiner* — Teresa M Arroyo
(74) *Attorney, Agent, or Firm* — McDermott Will & Emery LLP

(57) ABSTRACT

A semiconductor device and a manufacturing method therefor wherein a wire for coupling an inner lead and a semiconductor chip with each other can be prevented from being electrically short-circuited to any other conductive part are provided. An inner lead portion has a tip arranged outside the outer circumferential end of the semiconductor chip as viewed on a plane. A power supply bar has a jutted portion extended between the outer circumferential end of the semiconductor chip and the tip of the inner lead portion as viewed on a plane. The upper face of the jutted portion is in a position lower than the upper face of the tip of the inner lead portion. A bonding wire for electrically coupling the semiconductor chip and the inner lead portion with each other has a bent portion outside the outer circumferential end of the semiconductor chip as viewed on a plane.

4 Claims, 17 Drawing Sheets

SEMICONDUCTOR DEVICE INCLUDING POWER SUPPLY BAR HAVING JUTTED PORTION, PARALLEL RUNNING PORTION AND BENT PORTION AND MANUFACTURING METHOD THEREFOR

CROSS-REFERENCE TO RELATED APPLICATIONS

The disclosure of Japanese Patent Application No. 2008-172585 filed on Jul. 1, 2008 including the specification, drawings and abstract is incorporated herein by reference in its entirety.

BACKGROUND OF THE INVENTION

The present invention relates to semiconductor devices and manufacturing methods therefor and in particular to a semiconductor device having an inner lead portion electrically coupled with a semiconductor chip through a bonding wire and a manufacturing method therefor.

When semiconductor packages are considered in terms of sealing structure, they are classified into two categories: hermetically sealed package and non-hermetically sealed package. Among non-hermetically sealed packages, especially, transfer mold type plastic packages are in the mainstream.

This plastic package has such a structure that a semiconductor chip and leads are coupled with each other through wires and they are sealed with resin. This type of semiconductor device is disclosed in, for example, Japanese Unexamined Patent Publication No. Hei 6 (1994)-252328.

PATENT DOCUMENT

Japanese Unexamined Patent Publication No. Hei 6 (1994)-252328

SUMMARY OF THE INVENTION

When a chip, such as SoC (System on Chip), obtained by building a system itself into one chip is used, a large number of leads for input/output are required. In this case, the spacing between wires is reduced and leads are prone to be electrically short-circuited to one another. Leads cannot be brought close to a chip to avoid this and because of a processing problem and this lengthens wires coupling a semiconductor chip and leads with each other.

Providing a GND ring or a bus bar (power supply bar) is a recent common practice for the reduction of number of leads. The present inventors found the following problem arising when a power supply bar for supplying power to a semiconductor chip is extended to the area between a semiconductor chip and the tip of an inner lead: wires for coupling inner leads and the semiconductor chip with each other are lengthened and this makes it difficult to loop wires; and as a result, a wire collides with the power supply bar during the bonding thereof or any other like trouble occurs and the wire is electrically short-circuited to the power supply bar or other wires.

The invention has been made based on the above findings of the present inventors. It is an object of the invention to provide a semiconductor device in which wires for coupling inner leads and a semiconductor chip with each other can be prevented from being electrically short-circuited to any other conductive part and a manufacturing method therefor.

A semiconductor device in an embodiment of the invention includes a semiconductor chip, inner lead portions, a power supply bar, and bonding wires. The inner lead portions have tips positioned outside the outer circumferential end of the semiconductor chip as viewed on a plane. The power supply bar has a jutted portion extended to between the outer circumferential end of the semiconductor chip and the tips of the inner lead portions as viewed on a plane. The bonding wires electrically couple the semiconductor chip and the inner lead portions with each other. The upper face of the jutted portion of the power supply bar is positioned at a height lower than the upper faces of the tips of the inner lead portions. The bonding wires have a bent portion positioned outside the outer circumferential end of the semiconductor chip as viewed on a plane.

In the semiconductor device in this embodiment, the upper face of the jutted portion of the power supply bar is positioned at a height lower than the upper faces of the tips of the inner lead portions. Therefore, even though a bonding wire at an inner lead portion collides with the power supply bar during the bonding thereof, the impact of the collision can be reduced. This makes it possible to suppress a bonding wire from being unintentionally bent (deformed) by the impact of the collision. As a result, it is possible to prevent a bonding wire for coupling an inner lead portion and a semiconductor chip from being electrically short-circuited to any other conductive part.

DETAILED DESCRIPTION OF THE PREFERRED EMBODIMENTS

Hereafter, description will be given to embodiments of the invention with reference to the drawings.

First Embodiment

Figure 1:
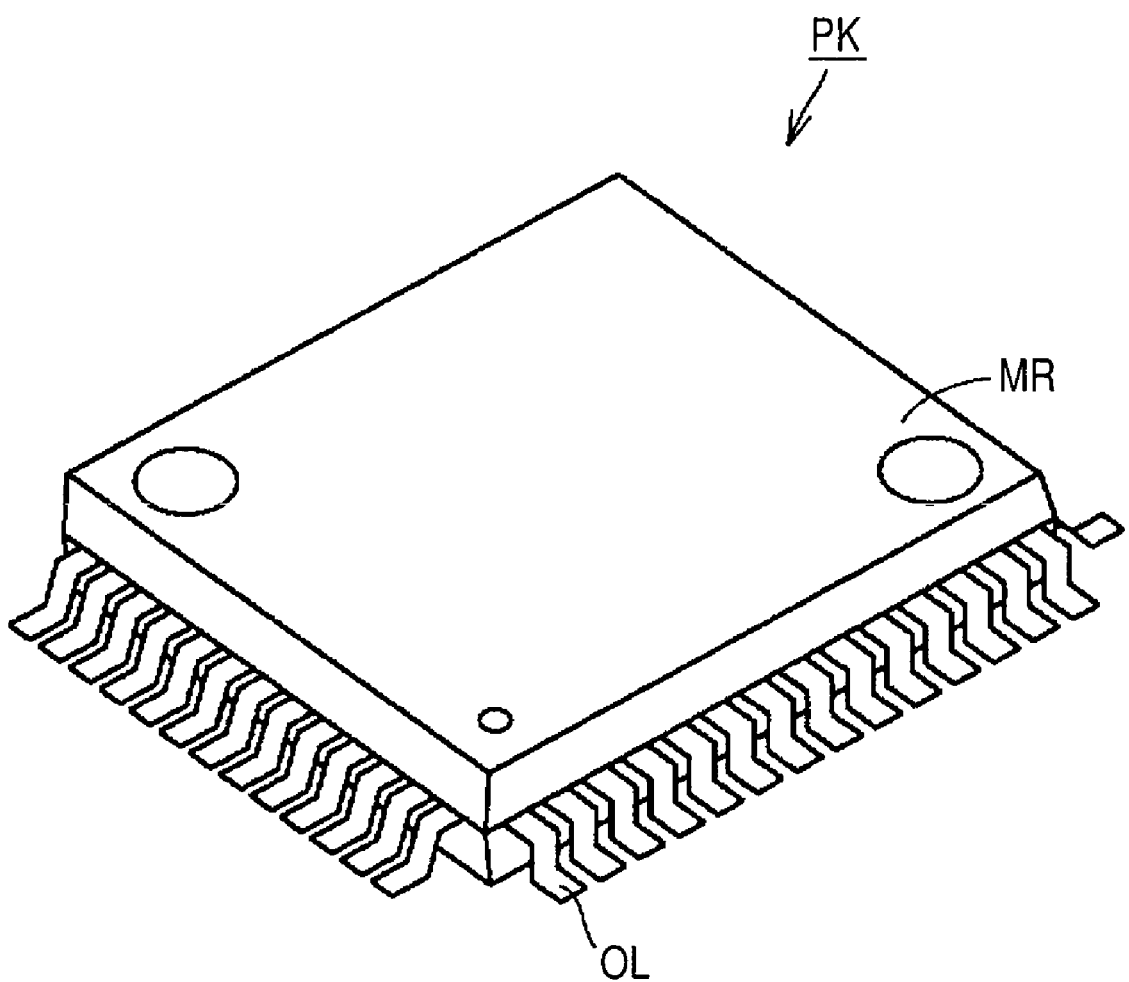
FIG. 1 is a perspective view schematically illustrating the configuration of a semiconductor device in a first embodiment of the invention.

FIG. 1 is a perspective view schematically illustrating the configuration of a semiconductor device in the first embodiment of the invention. As illustrated in FIG. 1, the semiconductor device in this embodiment is a transfer mold type plastic package PK, for example, QFP (Quad Flat Package). In this type of package PK, outer lead portions OL are protruded from all the four sides on the circumference of sealing resin MR.

Figure 2:
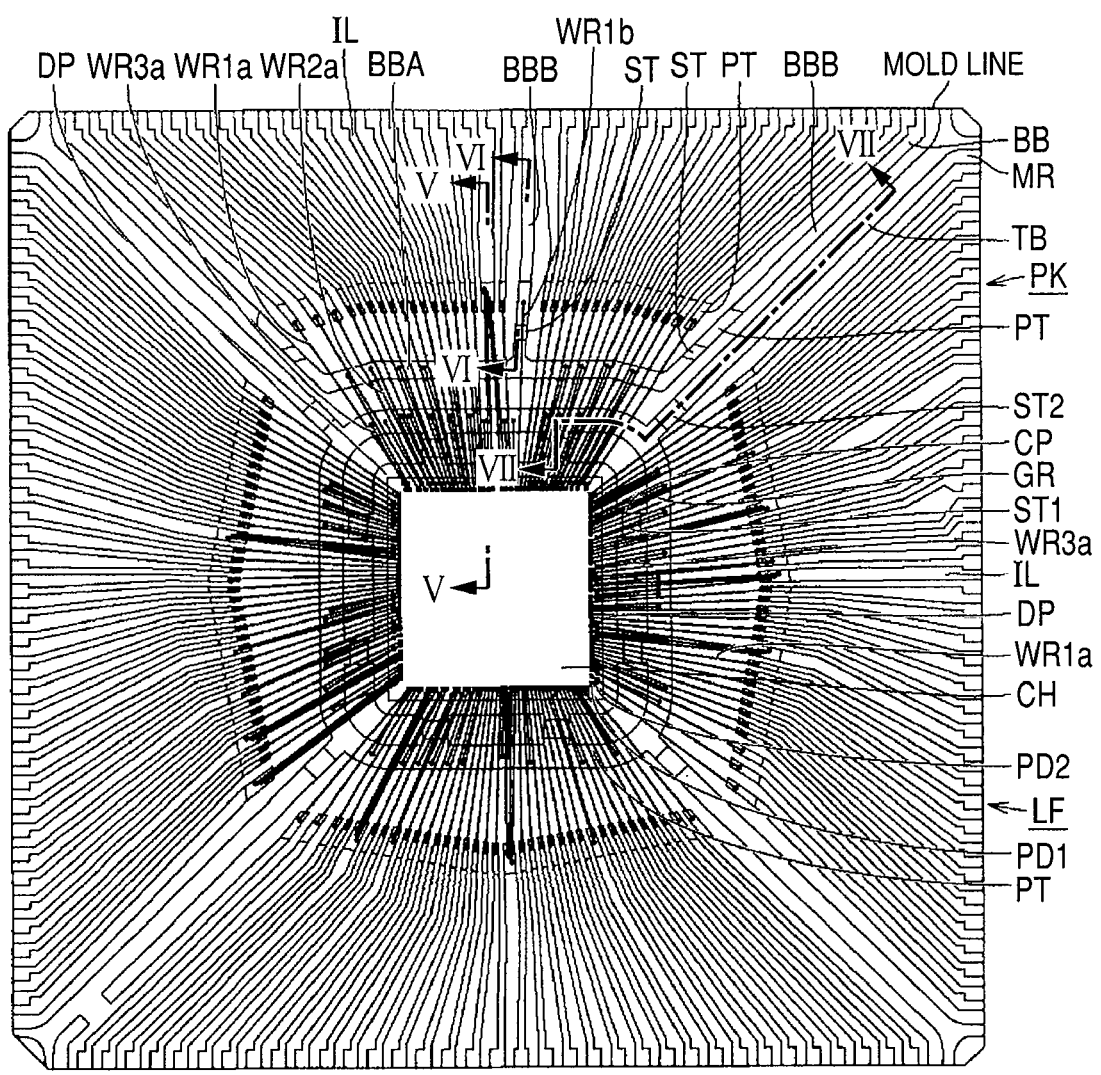
FIG. 2 is a schematic plan view illustrating the interior of the package PK illustrated in FIG. 1, as seen through sealing resin.
Figure 3:
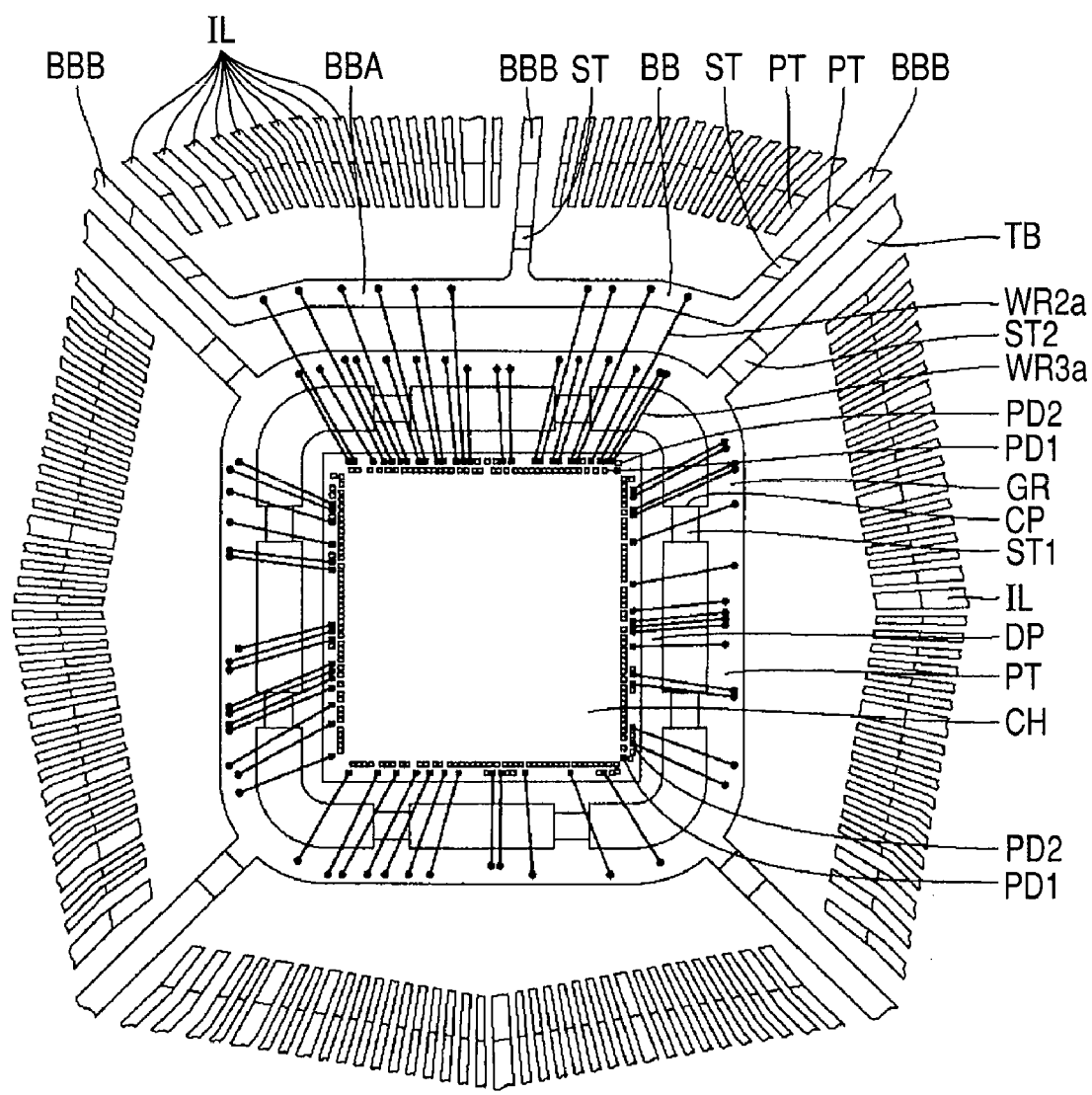
FIG. 3 is an enlarged view of FIG. 2 with bonding wires bonded to inner lead portions omitted.
Figure 4:
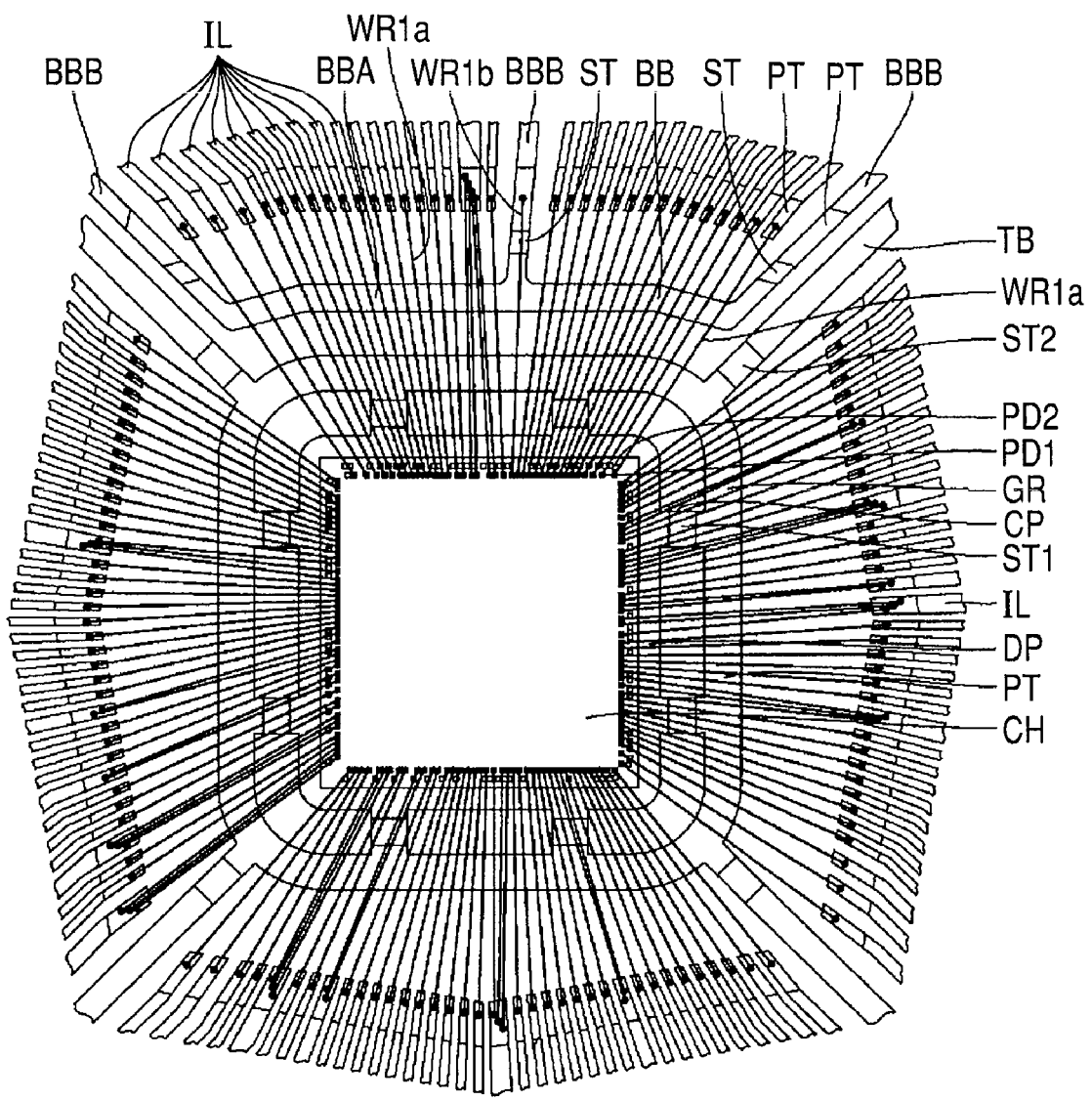
FIG. 4 is an enlarge view of FIG. 2 with bonding wires bonded to a power supply bar or a GND ring omitted.
Figure 5:
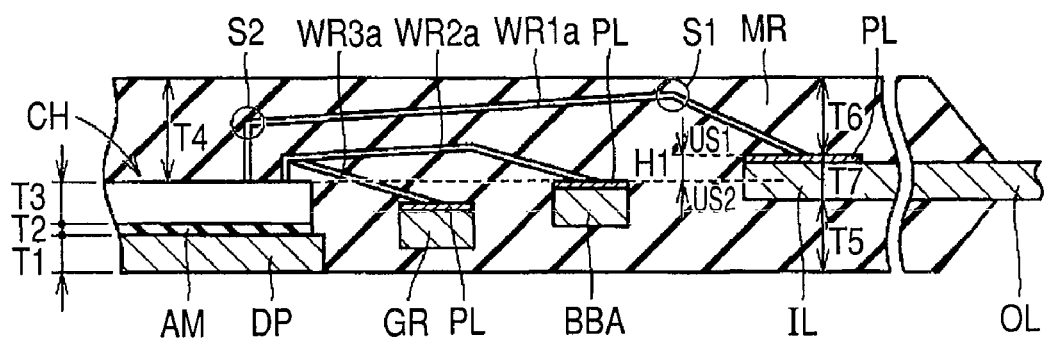
FIG. 5 is a schematic sectional view taken along line V-V of FIG. 2.
Figure 6:
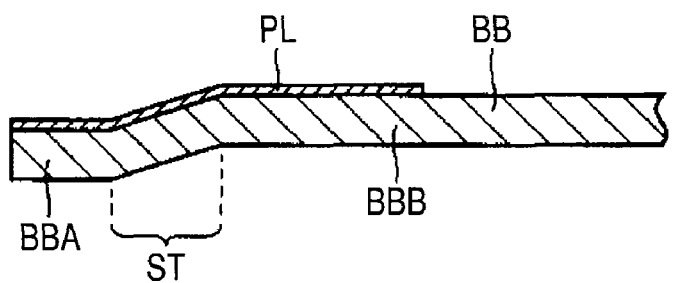
FIG. 6 is a schematic sectional view taken along line VI-VI of FIG. 2.
Figure 7:
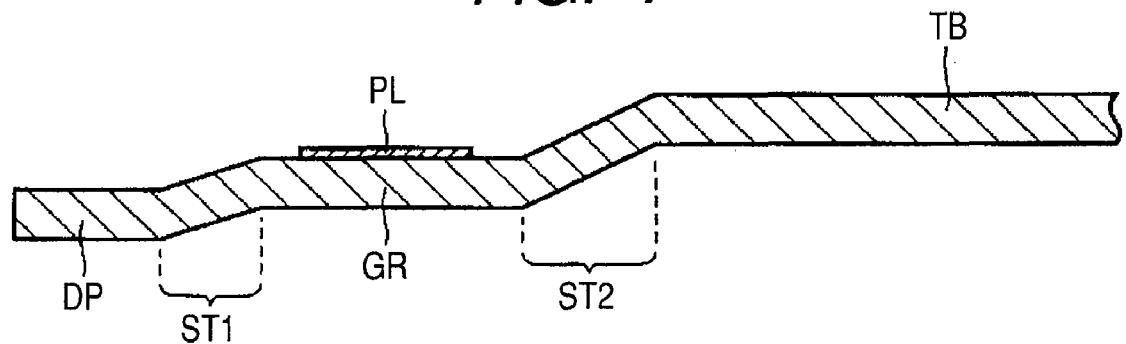
FIG. 7 is a schematic sectional view taken along line VII-VII of FIG. 2.

FIG. 2 is a schematic plan view illustrating the interior of the package PK illustrated in FIG. 1 as seen though the sealing resin. FIG. 3 is an enlarged view of FIG. 2 and in this drawing, bonding wires bonded to the inner lead portions are omitted. FIG. 4 is an enlarged view of FIG. 2 and in this drawing bonding wires bonded to the power supply bar or the GND ring are omitted. FIG. 5, FIG. 6, and FIG. 7 are schematic sectional views respectively taken along line V-V, line VI-VI, and line VII-VII of FIG. 2.

FIG. 6 illustrates a section of only the power supply bar and FIG. 7 illustrates a section of the die pad, the GND ring, a suspending lead, and the like.

As illustrated in FIG. 2 to FIG. 5, a semiconductor chip CH, a lead frame LF, and bonding wires WR1$a$, WR1$b$, WR2$a$, WR3$a$ are arranged in the sealing resin MR in the package PK. The semiconductor chip CH has, for example, SoC built therein. The semiconductor chip CH has in the upper face thereof a pad group comprised of multiple bonding pads PD1 arranged on the inner radius side and a pad group comprised of multiple bonding pads PD2 arranged on the outer radius side.

The lead frame LF mainly includes a die pad DP, multiple inner lead portions IL, a power supply bar (bus bar) BB, a GND ring GR, coupling portions CP, and suspending leads TB.

The die pad DP is positioned substantially in the center of the lead frame LF and the semiconductor chip CH is mounted over this die pad DP through adhesive AM. The inner lead portions IL are used to transmit and receive input/output signals to and from the semiconductor chip CH and are arranged, for example, radially with the semiconductor chip CH at the center. The tip of each of the inner lead portions IL is positioned outside the respective outer circumferential ends of the die pad DP and the semiconductor chip CH as viewed on a plane.

The power supply bar BB is used to supply power supply potential to the semiconductor chip CH. The power supply bar BB includes a jutted portion BBA and parallel running portions BBB. The parallel running portions BBB are extended from the inner radius side to the outer radius side of the package PK so that they run in parallel with the inner lead portions IL adjoining to the parallel running portions BBB with a gap in-between. The jutted portion BBA of the power supply bar BB is coupled to the tips of the parallel running portions BBB on the inner radius side. At the same time, the jutted portion is jutted out so that it is extended between the outer circumferential end of the semiconductor chip CH and the tips of inner lead portions IL with a gap in-between as viewed on a plane.

In this embodiment, three parallel running portions BBB are coupled to the jutted portion BBA. More specific description will be given. Two parallel running portions BBB are respectively coupled to one end and the other end of the jutted portion BBA and the remaining one parallel running portion BBB is coupled to the jutted portion BBA in a position between the one end and the other end.

The GND ring GR is used to supply GND potential to the semiconductor chip CH. The GND ring GR is positioned outside the outer circumferential end of the die pad DP and between the jutted portion BBA of the power supply bar BB and the die pad as viewed on a plane. The GND ring GR is so arranged that it encircles the outer circumference of the die pad DP.

The coupling portions CP are used to join the die pad DP and the GND ring GR with each other and, for example, two coupling portions are provided on each side of the die pad DP as viewed on a plane. The suspending leads TB are respectively coupled to the four corners of the GND ring GR and are extended from their portions of coupling with the GND ring GR toward the outer circumferential side.

As illustrated mainly in FIG. 3, some of the bonding pads PD2 positioned on the outer radius side are respectively electrically coupled to multiple points on the jutted portion BBA of the power supply bar BB through bonding wires WR2$a$. The remaining bonding pads PD2 are respectively electrically coupled to multiple points on the GND ring GR through bonding wires WR3$a$.

As illustrated mainly in FIG. 4, some of the bonding pads PD1 positioned on the inner radius side are respectively electrically coupled to the inner lead portions IL through bonding wires WR1$a$. For example, one of the bonding pads PD1 positioned on the inner radius side is electrically coupled to a parallel running portion BBB of the power supply bar BB through a bonding wire WR1$b$.

As illustrated mainly in FIG. 5, the upper face (points at which the bonding wires WR2$a$ are bonded) of the jutted portion BBA of the power supply bar BB is positioned at a height lower than the upper faces of the tips of the inner lead portions IL. It is desirable that the height position US1 of the upper face of the tip of each inner lead portion IL should be equal to or higher than the height position US2 of the upper face of the semiconductor chip CH.

Each bonding wire WR1$a$ mainly includes a bent portion S1 positioned outside the outer circumferential end of the semiconductor chip CH and a bent portion S2 positioned directly above the semiconductor chip CH. Each inner lead portion IL has a plating layer PL at a point where a bonding wire WR1a is bonded.

The jutted portion BBA of the power supply bar BB has a plating layer PL at a point where a bonding wire WR2a is bonded. The GND ring GR has a plating layer PL at a point where a bonding wire WR3a is bonded.

The bonding wires WR1a are so wired that they are caused to run above the bonding wires WR2a, WR3a in the drawing by the bent portions S1, S2 formed by reforming. The bonding wires WR2a, WR3a are so depicted that they partly overlap each other in the area directly above the semiconductor chip CH; however, they are not electrically short-circuited to each other.

As illustrated mainly in FIG. 6, the power supply bar BB has a bent portion (stepped portion or inclined portion) ST bent so that the upper face of the jutted portion BBA is lower than the upper faces of the parallel running portions BBB. As a result, the upper faces of the parallel running portions BBB are positioned at substantially the same height as the upper faces of the inner lead portions IL; and the upper face of the jutted portion BBA is positioned at a height lower than the upper faces of the inner lead portions IL.

As illustrated mainly in FIG. 7, a bent portion (stepped portion or inclined portion) ST2 is formed between each suspending lead TB and the GND ring GR. These bent portions are bent so that the upper face of the GND ring GR is lower than the upper faces of the suspending leads TB. As a result, the upper faces of the suspending leads TB are positioned at substantially the same height as the upper faces of the inner lead portions IL; and the upper face of the GND ring GR is positioned at a height lower than the upper face of the jutted portion BBA.

Bent portions (stepped portions or inclined portions) ST1 are formed between the GND ring GR and the die pad DP. These bent portions are so bent that the upper face of the die pad DP is lower than the upper face of the GND ring GR.

The thickness of each part of the semiconductor device in this embodiment is indicated in FIG. 5 as an example. That is, the thickness T1 of the die pad DP is 125 μm; the thickness T2 of the adhesive AM is 10 to 20 μm; the thickness T3 of the semiconductor chip CH is 400 μm; the thickness T4 of the sealing resin MR directly above the semiconductor chip CH is 452 to 462 μm; the thickness T5, T6 of the sealing resin MR directly under and directly above the inner lead portions IL is 436 μm; and the thickness T7 of the inner lead portions IL is 125 μm.

When the thickness of each part is set as mentioned above, the following takes place: the height position US1 of the upper face of each inner lead portion IL is higher than the height position US2 of the upper face of the semiconductor chip CH; and the difference H1 in height position is 16 to 26 μm. The upper face of the jutted portion BBA is positioned at a height lower by, for example, 150 μm or more than the upper faces of the inner lead portions IL. The upper face of the GND ring GR is positioned at a height lower than by, for example, 250 μm or more than the upper faces of the inner lead portions IL. The upper face of the die pad DP is positioned at a height lower by, for example, 500 μm or more than the upper faces of the inner lead portions IL.

However, the above difference H1 in height may be reduced because of transfer molding. Even in such a case, however, the height position US1 of the upper face of each inner lead portion IL is equal to or higher than the height position US2 of the upper face of the semiconductor chip CH.

Figure 8:
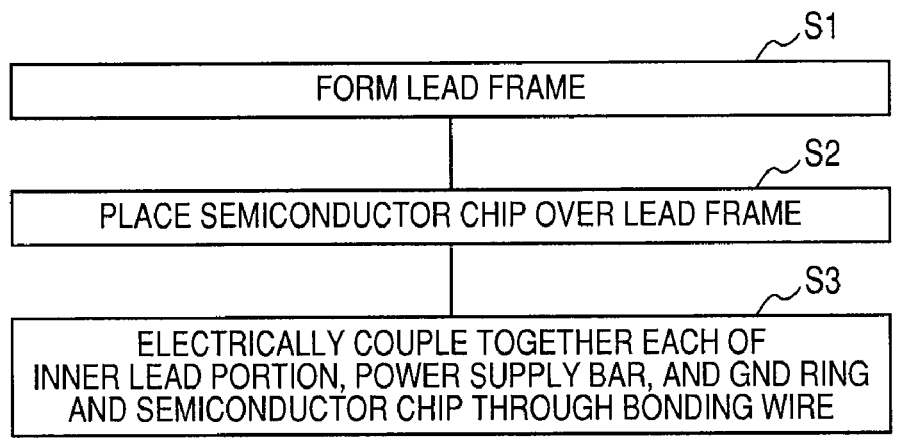
FIG. 8 is a flowchart illustrating a manufacturing method for semiconductor devices in the first embodiment of the invention.

Description will be given to a manufacturing method for semiconductor devices in this embodiment. FIG. 8 is a flowchart illustrating the manufacturing method for semiconductor devices in the first embodiment of the invention. As illustrated in FIG. 8, first, a lead frame LF is prepared (Step S1). This lead frame LF is so formed that it includes at least: inner lead portions IL having tips positioned outside the outer circumferential end of an area (for example, die pad DP) where a semiconductor chip CH should be placed as viewed on a plane; and a power supply bar BB having a jutted portion BBA extended between the outer circumferential end and the tips of the inner lead portions IL as viewed on a plane.

At this time, the lead frame LF is so prepared that the following are simultaneously implemented as illustrated in FIG. 5; the upper face of the jutted portion BBA of the power supply bar BB is positioned at a height lower than the upper face of the tip of each inner lead portion IL; the upper face of the GND ring GR is positioned at a height lower than the upper face of the jutted portion BBA; and the upper face of the die pad DP is positioned at a height lower than the upper face of the GND ring GR.

Thereafter, the semiconductor chip CH is bonded to an area (for example, die pad DP) in the lead frame LF where the semiconductor chip CH should be placed through adhesive AM or the like (Step S2).

Thereafter, the semiconductor chip CH and the inner lead portions IL are electrically coupled with each other through bonding wires WR1a; and the semiconductor chip CH and the parallel running portions BBB of the power supply bar BB are electrically coupled with each other through bonding wires WR1b. Further, the semiconductor chip CH and the jutted portion BBA of the power supply bar BB are electrically coupled with each other through bonding wires WR2a; and the semiconductor chip CH and the GND ring GR are electrically coupled with each other through bonding wires WR3a (Step S3). At this time, the bonding wires WR1a and the like are reformed to provide the bent portions S1, S2 and the like so that the bonding wires WR1a, WR1b run above the bonding wires WR2a, WR3a.

At least immediately after the above wire bonding, the height position of the upper face of the tip of each inner lead portion IL is equal to or higher than the height position of the upper face of the semiconductor chip CH.

Thereafter, the semiconductor chip CH, bonding wires WR1a to WR3a, and the like are sealed by, for example, transfer molding and at the same time the sealing resin MR is so formed that the under surface of the die pad DP is exposed. Thus the manufacture of the semiconductor device in this embodiment is completed.

According to this embodiment, the height position of the upper face of each inner lead portion IL is equal to or higher than the height position of the upper face of the semiconductor chip CH. Further, even though the length of each bonding wire WR1a is increased, the bonding wire WR1a is suppressed from being electrically short-circuited to any other bonding wire WR2a, WR3a or the power supply bar BB. Hereafter, this will be described in detail.

Figure 9:
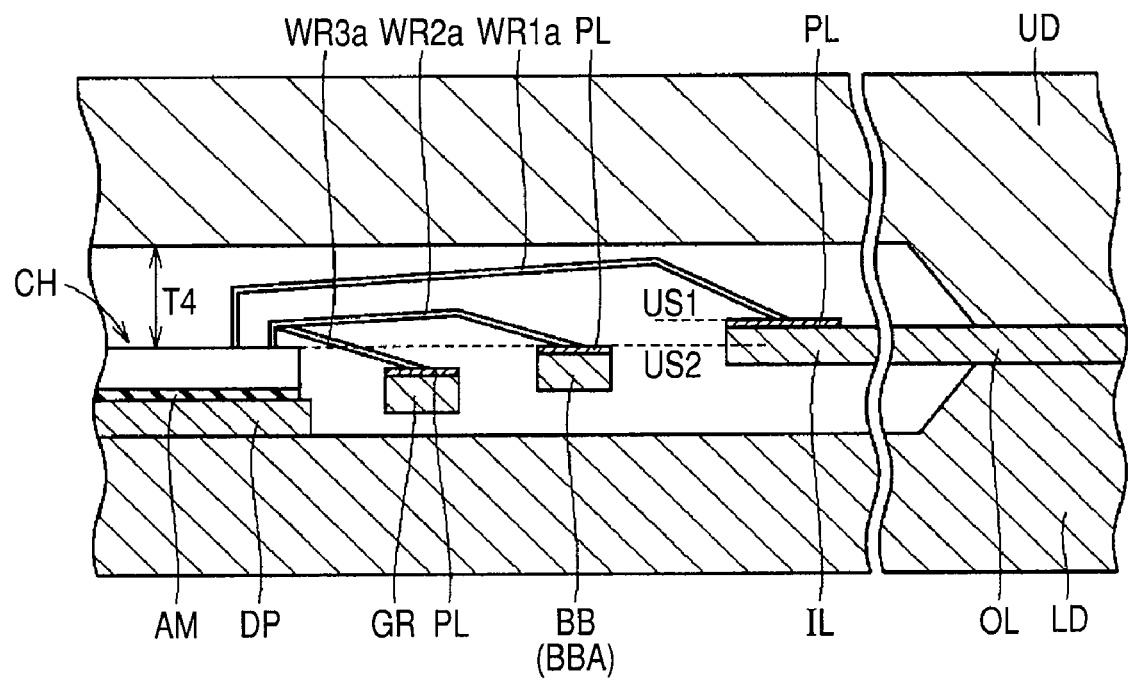
FIG. 9 is a schematic sectional view how transfer molding is carried out in the manufacturing method for semiconductor devices in the first embodiment of the invention.

First, description will be given to a case where the height position of the upper face of each inner lead portion IL is equal to or higher than the height position of the upper face of the semiconductor chip CH. FIG. 9 is a schematic sectional view illustrating how transfer molding is carried out in the manufacturing method for semiconductor devices in the first embodiment of the invention. When transfer molding is carried out, as illustrated in FIG. 9, usually, the outer lead portions OL are clamped in a substantially intermediate position between a lower die LD and an upper die UD.

In this embodiment, meanwhile, it is required to expose the under surface of the die pad DP from the sealing resin MR and thus the die pad DP is set in contact with the lower die LD. Further, it is required to increase the thickness T4 covered by the sealing resin MR directly above the semiconductor chip CH to some extent so that the bonding wires WR1a to WR3a, WR1b are not exposed from the sealing resin MR.

As mentioned above, the inner lead portions IL leading to the outer lead portions OL are positioned substantially at the midpoint of the thickness of the semiconductor device. Meanwhile, it is required to increase the thickness T4 of the sealing resin directly above the semiconductor chip CH. This leads to a state in which the height position of the upper face of each inner lead portion IL is equal to or higher than the height position of the upper face of the semiconductor chip CH. In this state, a bonding wire WR1a is extended upward from the upper face of the semiconductor chip CH to the upper face of each inner lead portion IL and thus this state is designated as the state of so-called upward bonding.

Figure 10:
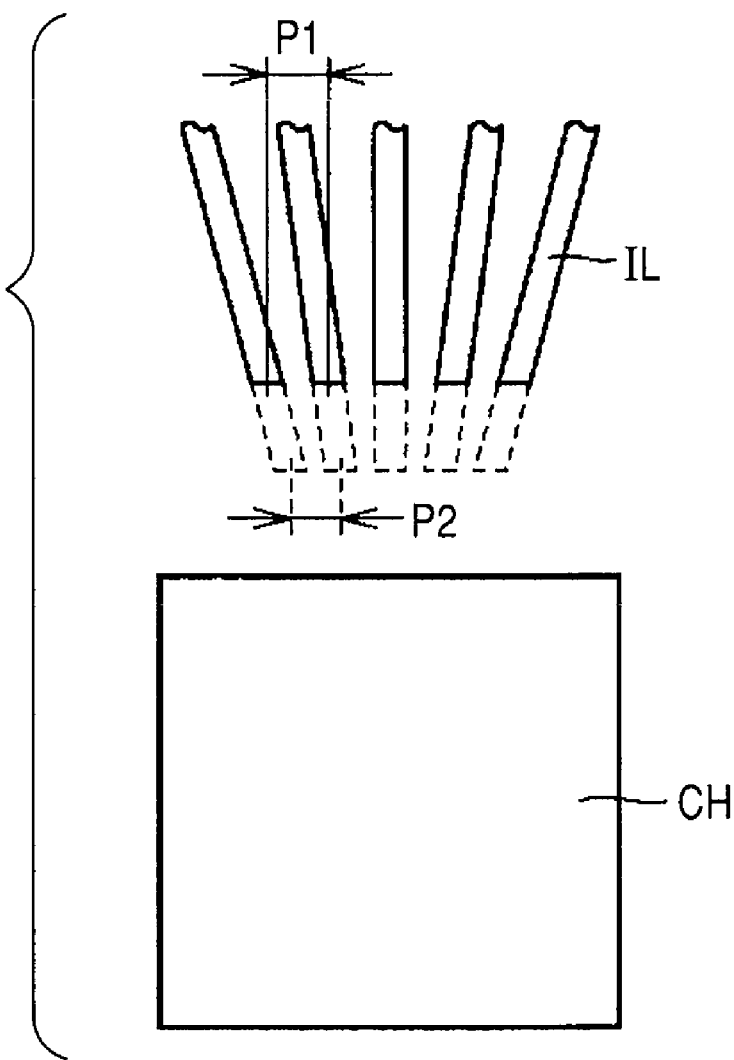
FIG. 10 is plan view explaining the relation between the positional relation between a semiconductor chip and inner lead portions and the pitch of the inner lead portions.

Description will be given to a case where the length of each bonding wire WR1a is increased. FIG. 10 is a plan view explaining the relation between the positional relation between a semiconductor chip and inner lead portions and the pitch of the inner lead portions. In case of, for example, QFP or the like, as illustrated in FIG. 10, a large number of inner lead portions IL are radially arranged with the semiconductor chip CH at the center. For this reason, the pitch P2 of inner lead portions IL is smaller than the pitch P1 of the inner lead portions IL on the assumption that: the pitch P2 is obtained when the tips of the inner lead portions IL are positioned on the inner radius side; and the pitch P1 is obtained when the tips of the inner lead portions IL are positioned on the outer radius side.

When a system itself is built into one semiconductor chip CH as in SoC, a large number of inner lead portions IL for input/output are required. For this reason, a problem arises when the inner lead portions IL are extended to the inner radius side and brought too close to the semiconductor chip CH. The pitch P2 of the inner lead portions IL becomes too small and the width of each lead is accordingly reduced. This makes it difficult to process the frame and to bond a wire bond thereonto during assembly. Especially, when a large number of inner lead portions IL are required as in SoC, the tip of each inner lead portion IL cannot be brought too close to the semiconductor chip CH. As a result, the length of each bonding wire WR1a for coupling the semiconductor chip CH and an inner lead portion IL with each other is increased.

Figure 11:
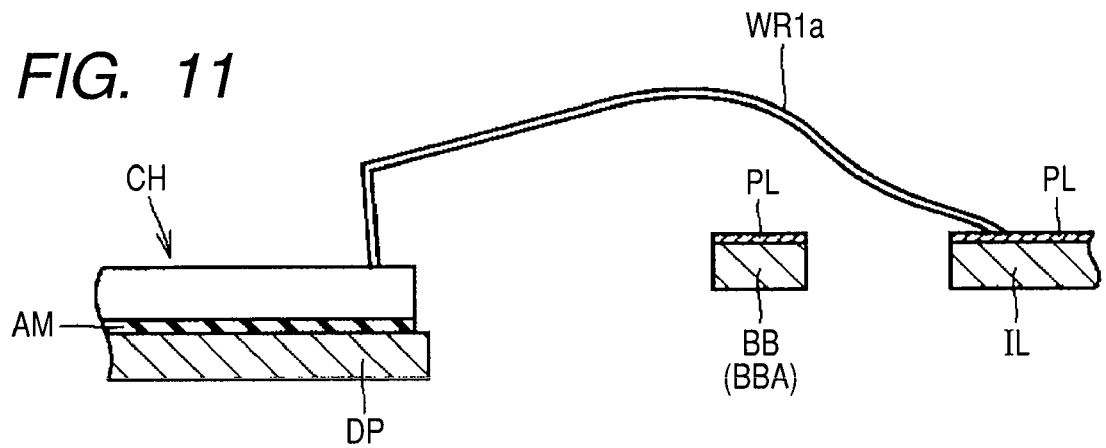
FIG. 11 is a schematic sectional view illustrating how a bonding wire is not reformed in so-called upward bonding.

Description will be given to that when the length of each bonding wire WR1a is increased in so-called upward bonding, the bonding wire WR1a becomes prone to be electrically short-circuited to any other bonding wire WR2a, WR3a or the power supply bar BB. FIG. 11 is a schematic sectional view illustrating a case where a bonding wire is not reformed in so-called upward bonding. In so-called upward bonding, as illustrated in FIG. 11, a gold wire to be a bonding wire WR1a is looped without pulling the gold wire so much. For this reason, if a gold wire is stitched to an inner lead portion IL in this state, the loop of the gold wire is largely crooked upward. In this case, the loop of the bonding wire WR1a becomes high. As a result, the bonding wire WR1a may flow and be electrically short-circuited to any other wire or the like during transfer molding or may be exposed from the sealing resin MR after transfer molding.

Figure 12:
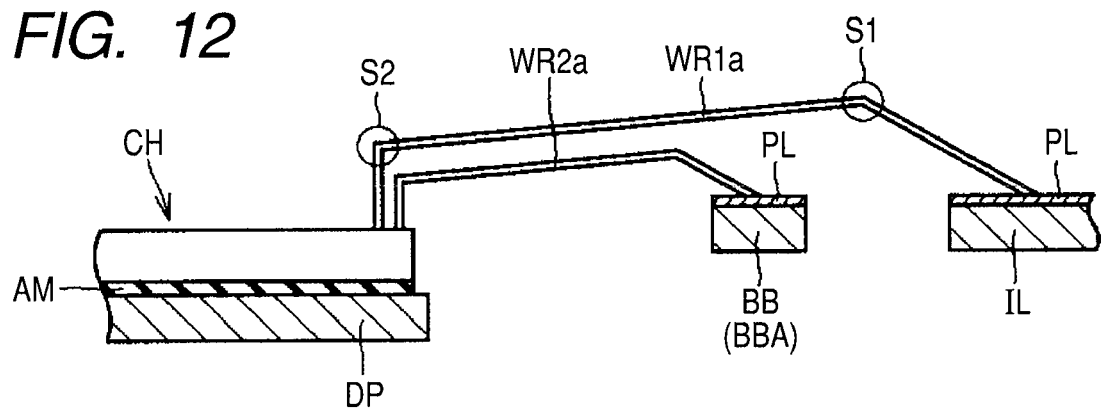
FIG. 12 is a schematic sectional view illustrating how a bonding wire is reformed in so-called upward bonding.

Consequently, it is required to make the loop of each bonding wire WR1a low as illustrated in FIG. 12 to prevent the bonding wire WR1a from being crooked as mentioned above.

Figure 13:
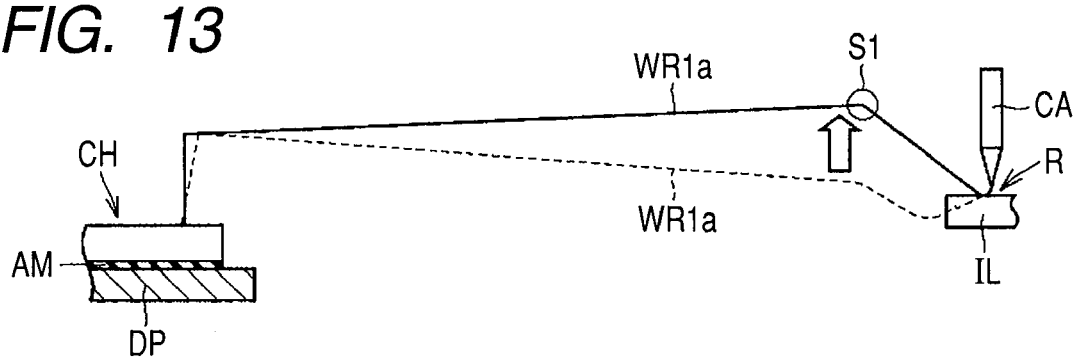
FIG. 13 is a drawing explaining a phenomenon that when a bent portion S1 is formed by reforming, a bonding wire sags down due to inertia force.

The gold wire to be the bonding wire WR1a has rigidity to some extent and is bent with some curvature (R) as illustrated in FIG. 13 after it is protruded downward from a capillary CA. For this reason, the gold wire is brought into contact with the upper face of an inner lead portion IL at the portion of curvature (R) without exception. During stitching, therefore, the gold wire is joined with the inner lead portion IL by forcedly pressing the portion of curvature (R) of the gold wire against the inner lead portion IL. Consequently, it is required to forcedly press the gold wire against the inner lead portion IL by bowing the gold wire downward as indicated by broken line in the FIG. 13 immediately before stitching. As a result, the loop of the gold wire is shifted to under the inner lead portion IL.

The present inventors found that the following takes place, especially, when the loop of a bonding wire WR1a is to be lowered in so-called upward bonding: downward bowing of the gold wire immediately before stitching is increased with the movement of the capillary to form a low loop. As a result, the bonding wire WR1a is brought into contact with the jutted portion BBA and the bonding wire WR2a, WR3a positioned beneath and is electrically short-circuited thereto.

The present inventors also found that when the length of a bonding wire WR1a is increased by an amount exceeding 3 to 4 mm, the above phenomenon becomes significantly prone to occur. That is, the bonding wire WR1a is prone to be electrically short-circuited to the jutted portion BBA, bonding wire WR2a, WR3a, or the like. A possible reason for this is as follows: when the length of a bonding wire WR1a is increased by an amount exceeding 3 to 4 mm, the amount of downward bowing of the bonding wire WR1a is increased when it is bent to form the bent portion S1.

As mentioned above, when a bonding wire WR1a is lengthened in so-called upward bonding, the bonding wire WR1a is prone to be electrically short-circuited to any other bonding wire WR2a, WR3a or the power supply bar BB.

The bent portion S1 in the bonding wire WR1a illustrated in FIG. 13 is formed when the gold wire is bowed downward as indicated by broken line immediately before stitching.

In this embodiment, meanwhile, the height position of the upper face of the jutted portion BBA of the power supply bar BB is lower than the height position of the upper face of each inner lead portion IL as illustrated in FIG. 5. For this reason, the following can be implemented when a gold wire is bowed downward as indicated by broken line in FIG. 13 and forcedly pressed against an inner lead portion IL immediately before stitching: even though the bonding wire WR1a collides with the jutted portion BBA, bonding wire WR2a, WR3a, or the like positioned beneath, the impact of the collision can be reduced. This makes it possible to suppress the bonding wire WR1a from being unintentionally bent (deformed) by the impact of the collision and to also suppress the bonding wire WR1a from being brought into contact with the jutted portion BB or the like by this bend. More specific description will be given. In this embodiment, the impact of the collision is reduced and thus the following can be implemented: even though a bonding wire WR1a collides with the jutted portion BBA or the like, it is easily restored to a desired shape (the shape of bonding wire WR1a illustrated in FIG. 5); and the bonding wire WR1a becomes less prone to be kept in contact with the jutted portion BBA or the like. Therefore, it is possible to prevent a bonding wire WR1a for coupling an inner lead portion IL and a semiconductor chip with each other from being electrically short-circuited to any other conductive part (jutted portion BBA, bonding wire WR2a, WR3a, or the like).

Figure 14:
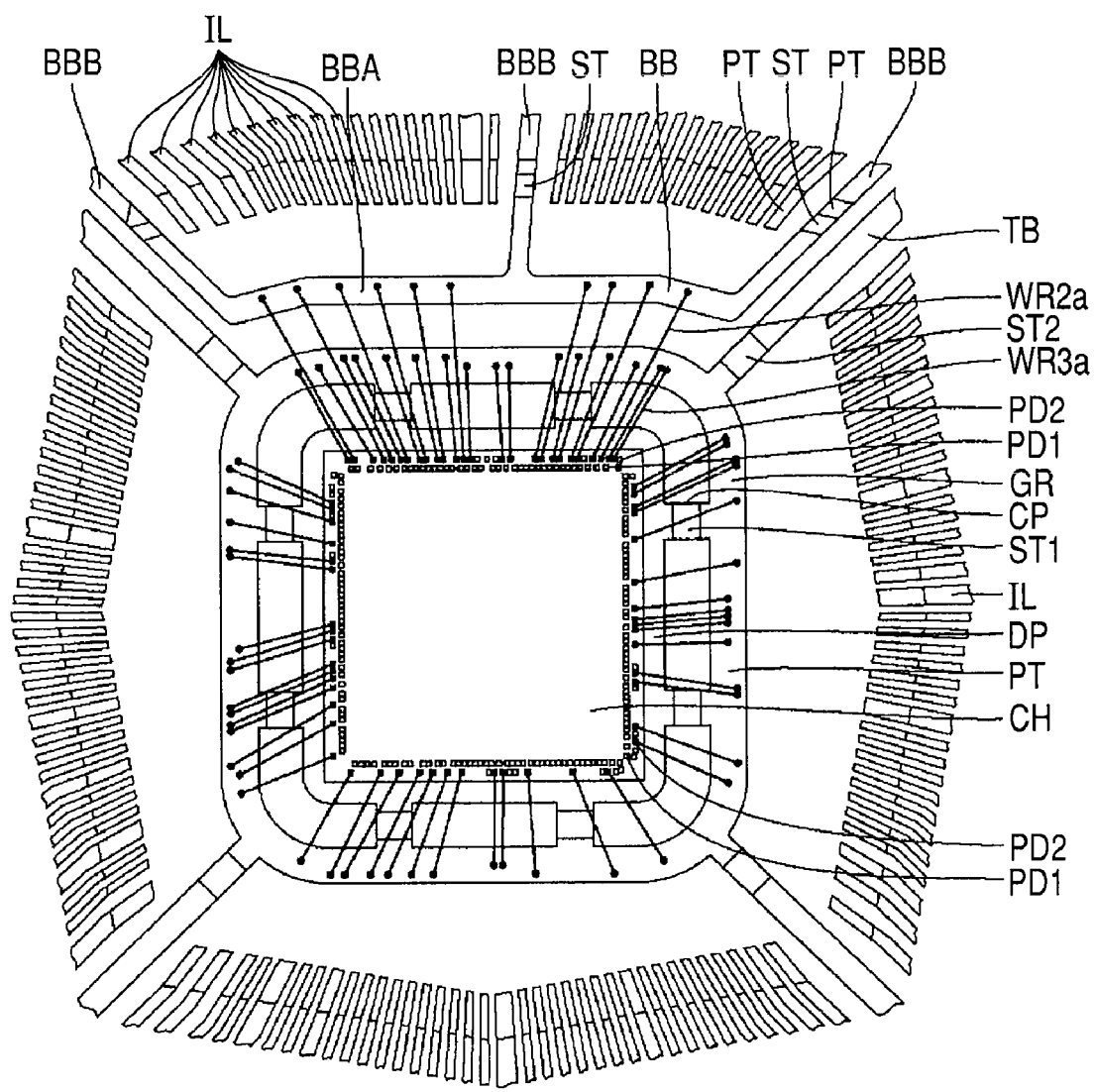
FIG. 14 is a schematic plan view illustrating a configuration in which a bent portion formed in a power supply bar is positioned outside the tips of inner lead portions as viewed on a plane.

The bent portions (stepped portions or inclined portions) ST formed in the power supply bar BB may be positioned on either of the following sides: the inner radius side relative to the tips of inner lead portions IL as viewed on a plane as illustrated in FIG. 2 to FIG. 4; and the outer radius side relative to the tips of inner lead portions IL as viewed on a plane as illustrated in FIG. 14.

Second Embodiment

Figure 15:
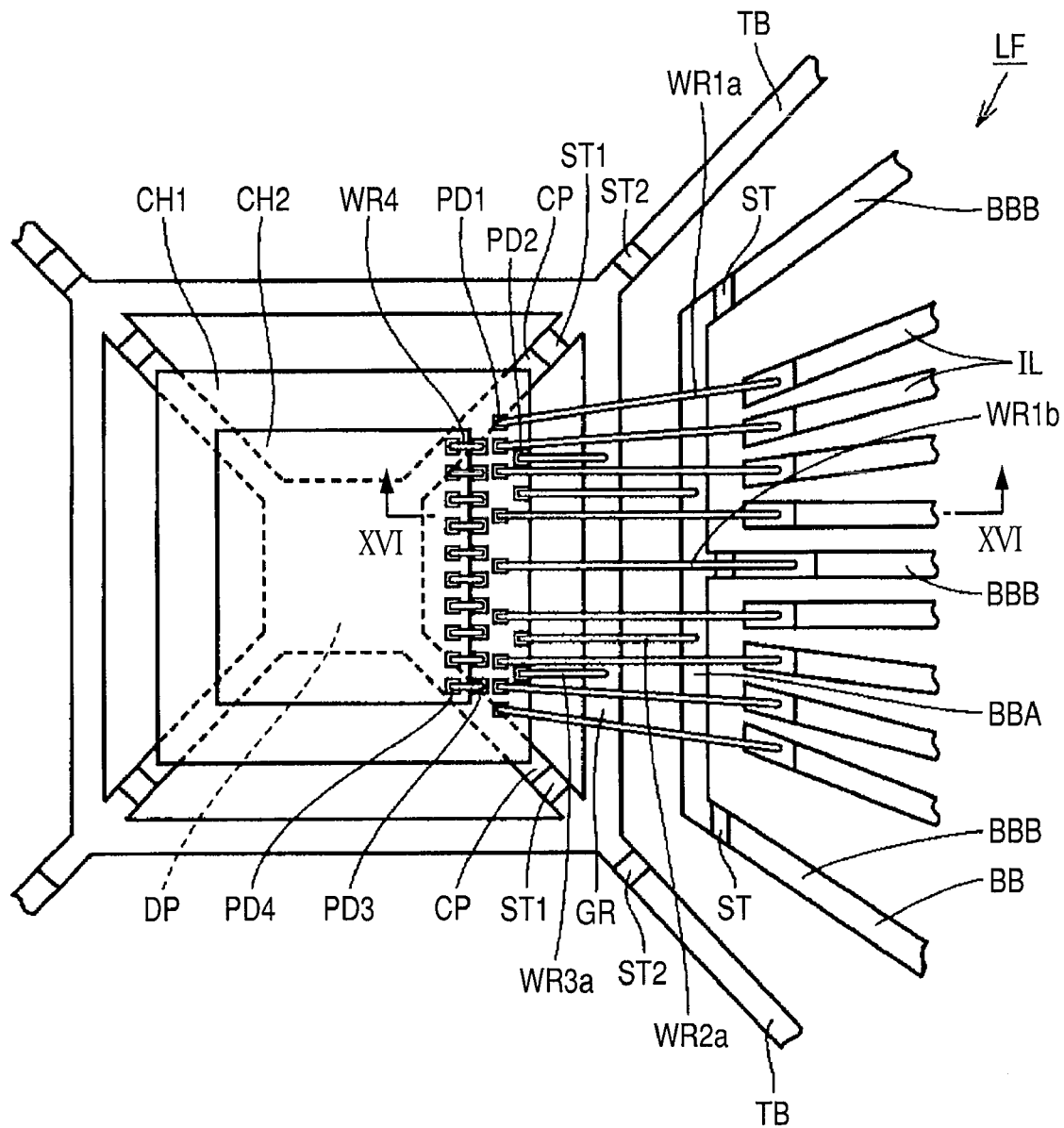
FIG. 15 is a schematic plan view illustrating the configuration of a semiconductor device in a second embodiment of the invention with the interior of the package depicted as seen through sealing resin.
Figure 16:
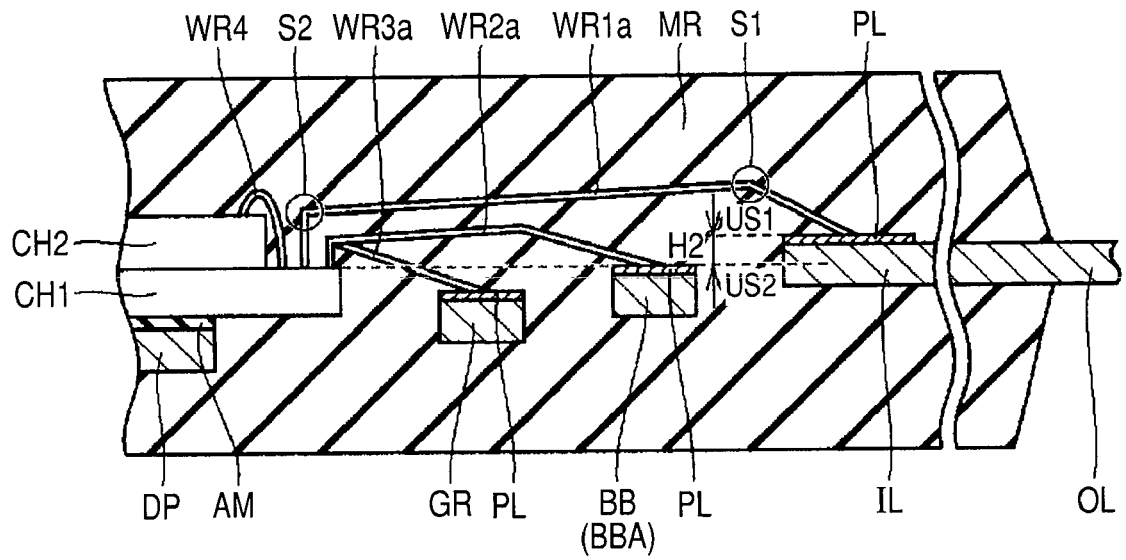
FIG. 16 is a schematic sectional view taken along line XVI-XVI of FIG. 15.

FIG. 15 is a schematic plan view schematically illustrating the configuration of a semiconductor device in the second embodiment of the invention, illustrating the interior of the package as seen through sealing resin. FIG. 16 is a schematic sectional view taken along line XVI-XVI of FIG. 15. As illustrated in FIG. 15 and FIG. 16, for example, two semiconductor chips CH1, CH2, a lead frame LF, and bonding wires WR1a to WR3a, WR4, WR1b are arranged in the sealing resin MR in the package PK. The two semiconductor chips CH1, CH2 are stacked together.

In the upper face of the semiconductor chip CH1 positioned on the lower side, bonding pads PD1 to PD3 arranged in three rows along the outer edge are formed. Of the bonding pads in three rows of the semiconductor chip CH1, the bonding pads PD3 on the innermost row are electrically coupled with bonding pads PD4 of the semiconductor chip CH2 through bonding wires WR4.

As in the configuration in the first embodiment, the lead frame LF includes a die pad DP, multiple inner lead portions IL, a power supply bar (bus bar) BB, a GND portion GR, coupling portions CP, and suspending leads TB. The semiconductor chip CH1 is mounted over the die pad DP through adhesive AM.

The inner lead portions IL are used to transmit and receive input/output signals to and from the semiconductor chips CH1, CH2. The tip of each of the inner lead portions IL is positioned outside the outer circumferential end of the semiconductor chip CH1 with a gap in-between as viewed on a plane.

The power supply bar BB is used to supply power supply potential to the semiconductor chips CH1, CH2. The power supply bar BB includes a jutted portion BBA and parallel running portions BBB. The parallel running portions BBB are extended from the inner radius side to the outer radius side so that they run in parallel with the inner lead portions IL adjoining thereto with a gap in-between. The jutted portion BBA of the power supply bar BB is coupled to the tips of the parallel running portions BBB on the inner radius side. At the same time, the jutted portion is jutted out so that it is extended between the outer circumferential ends of the semiconductor chips CH and the tips of inner lead portions IL as viewed on a plane.

In this embodiment, three parallel running portions BBB are coupled to the jutted portion BBA. More specific description will be given. Two parallel running portions BBB are respectively coupled to one end and the other end of the jutted portion BBA and the remaining one parallel running portion BBB is coupled to the jutted portion BBA in a position between the one end and the other end.

The GND portion GR is used to supply GND potential to the semiconductor chips CH1, CH2. The GND portion GR is positioned outside the outer circumferential end of the die pad DP and on the inner radius side relative to the jutted portion BBA of the power supply bar BB as viewed on a plane.

The coupling portions CP are used to join the die pad DP and the GND portion GR with each other and joins part of the outer circumferential end of the die pad DP and the ends of the GND portion GR with each other as viewed on a plane. The suspending leads TB are respectively coupled to the ends of the GND portion GR and are extended from the coupling portions to the outer radius side.

Some of bonding pads PD2 positioned on the outer radius side of the semiconductor chip CH1 are respectively electrically coupled to multiple points on the jutted portion BBA of the power supply bar BB through bonding wires WR2a. The remaining bonding pads PD2 are respectively electrically coupled to multiple points on the GND portion GR through bonding wires WR3a.

Some of the bonding pads PD1 positioned on the inner radius side of the semiconductor chip CH1 are respectively electrically coupled to inner lead portions IL through bonding wires WR1a. For example, one of the bonding pads PD1 positioned on the inner radius side is electrically coupled to a parallel running portion BBB of the power supply bar BB through a bonding wire WR1b.

As illustrated in FIG. 16, the upper face of the jutted portion BBA is positioned at a height lower than the upper face of the tip of each inner lead portion IL. (This upper face of the jutted portion is equivalent to points at which the bonding wires WR2a are bonded in the power supply bar BB.) The height position US1 of the upper face of the tip of each inner lead portion IL is positioned at a height equal to or higher than the height position US2 of the upper face of the semiconductor chip CH1.

Each bonding wire WR1a includes a bent portion S1 positioned outside the outer circumferential end of the semiconductor chip CH1 and a bent portion S2 positioned directly above the semiconductor chip CH1. Each inner lead portion IL has a plating layer PL at a point where a bonding wire WR1a is bonded.

The jutted portion BBA of the power supply bar BB has a plating layer PL at a point where a bonding wire WR2a is bonded. The GND portion GR has a plating layer PL at a point where a bonding wire WR3a is bonded.

The bonding wires WR1a, WR1b are so wired that they run above the bonding wires WR2a, WR3a in the drawing. The bonding wires WR2a, WR3a are so depicted that they partly overlap each other in the area directly above the semiconductor chip CH1; however, they are not electrically short-circuited to each other.

As illustrated in FIG. 15 and FIG. 16, the power supply bar BB has a bent portion (stepped portion or inclined portion) ST bent so that the upper face of the jutted portion BBA is lower than the upper faces of the parallel running portions BBB. As a result, the upper faces of the parallel running portions BBB are positioned at substantially the same height as the upper faces of the inner lead portions IL; and the upper face of the jutted portion BBA is positioned at a height lower than the upper faces of the inner lead portions IL.

A bent portion (stepped portion or inclined portion) ST2 is formed between each suspending lead TB and the GND portion GR. These bent portions are bent so that the upper face of the GND portion GR is lower than the upper faces of the suspending leads TB. As a result, the upper faces of the suspending leads TB are positioned at substantially the same height as the upper faces of the inner lead portions IL; and the upper face of the GND portion GR is positioned at a height lower than the upper face of the jutted portion BBA.

Bent portions (stepped portions or inclined portions) ST1 are formed between the GND portion GR and the die pad DP. These bent portions are so bent that the upper face of the die pad DP is lower than the upper face of the GND portion GR.

The semiconductor device in this embodiment is manufactured by the same manufacturing method as in the first embodiment. Also in the configuration in this embodiment, the height position of the upper face of each inner lead portion IL is equal to or higher than the height position of the upper face of the semiconductor chip CH1. Hereafter, this will be described.

Figure 17:
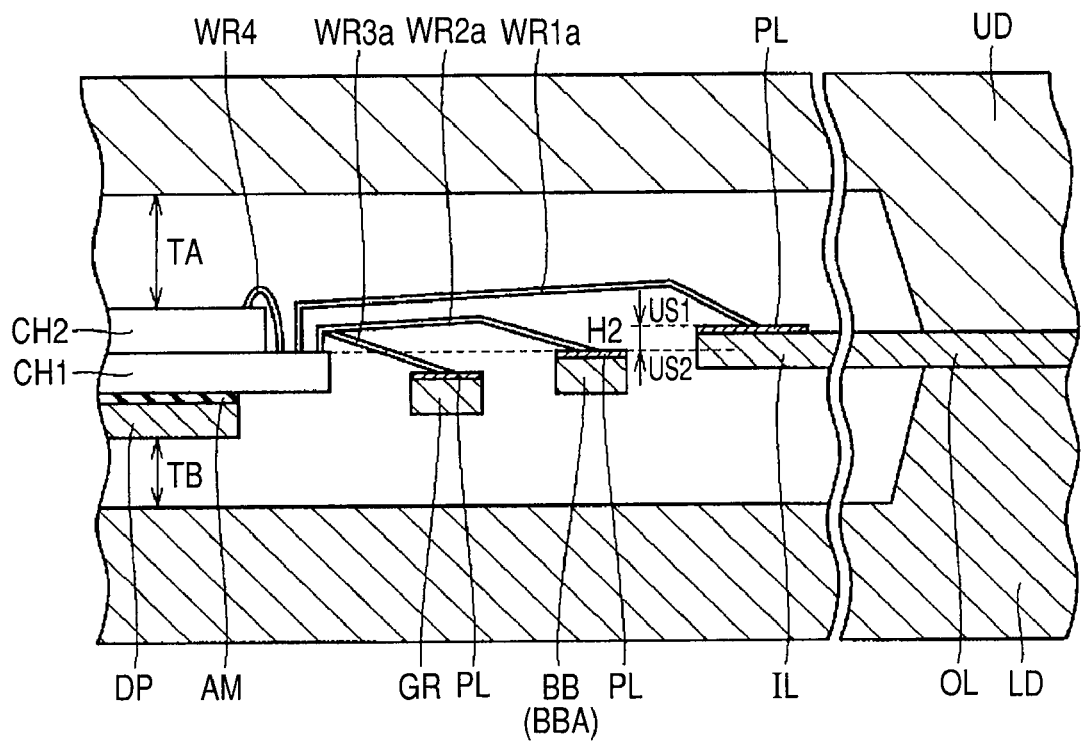
FIG. 17 is a schematic sectional view illustrating how transfer molding is carried out in a manufacturing method for semiconductor devices in the second embodiment of the invention.

FIG. 17 is a schematic sectional view illustrating how transfer molding is carried out in the manufacturing method for semiconductor devices in the second embodiment of the invention. When transfer molding is carried out, as illustrated in FIG. 17, usually, the outer lead portions OL are clamped in a substantially intermediate position between a lower die LD and an upper die UD.

In this embodiment, meanwhile, the under side of the die pad DP and the upper side of the semiconductor chip CH2 are covered with the sealing resin MR. In this case, it is required to take the following measure to prevent the bonding wires WR1a to WR3a, WR4, WR1b from being exposed from the sealing resin MR: the thickness TA of the sealing resin MR over the semiconductor chip CH2 is made larger than the thickness TB of the sealing resin MR under the die pad DP. The two semiconductor chips CH1, CH2 are stacked together.

As mentioned above, the inner lead portions IL leading to the outer lead portions OL are positioned substantially at the midpoint of the thickness of the semiconductor device. Meanwhile, it is required to make the thickness TA of the sealing resin directly above the semiconductor chip CH1 larger than the thickness TB of the sealing resin directly beneath and there is the semiconductor chip CH2 over the semiconductor chip CH1. This leads to a state in which the height position of the upper face of each inner lead portion IL is equal to or higher than the height position of the upper face of the semiconductor chip CH1. This state is designated as the state of so-called upward bonding.

As mentioned above, the state of upward bonding is established. In this configuration, therefore, the following takes place as in the first embodiment when the length of each bonding wire WR1a is increased: there is a possibility that the bonding wire WR1a becomes prone to be electrically short-circuited to any other bonding wire WR2a, WR3a or the power supply bar BB.

According to this embodiment, however, the height position of the upper face of the jutted portion BBA of the power supply bar BB is lower than the height position of the upper face of each inner lead portion IL as illustrated in FIG. 16. For this reason, the following can be implemented when a gold wire is bowed downward as indicated by broken line in FIG. 13 and forcedly pressed against an inner lead portion IL immediately before stitching: even though the bonding wire WR1a collides with the jutted portion BBA, bonding wire WR2a, WR3a, or the like positioned beneath, the impact of the collision can be reduced. This makes it possible to suppress the bonding wire WR1a from being unintentionally bent (deformed) by the impact of the collision and to suppress the bonding wire WR1a from being brought into contact with the jutted portion BB or the like by the impact of the collision. Therefore, it is possible to prevent a bonding wire WR1a for coupling an inner lead portion IL and the semiconductor chip CH1 with each other from being electrically short-circuited to any other conductive part (jutted portion BBA, bonding wire WR2a, WR3a, or the like).

Third Embodiment

Figure 18:
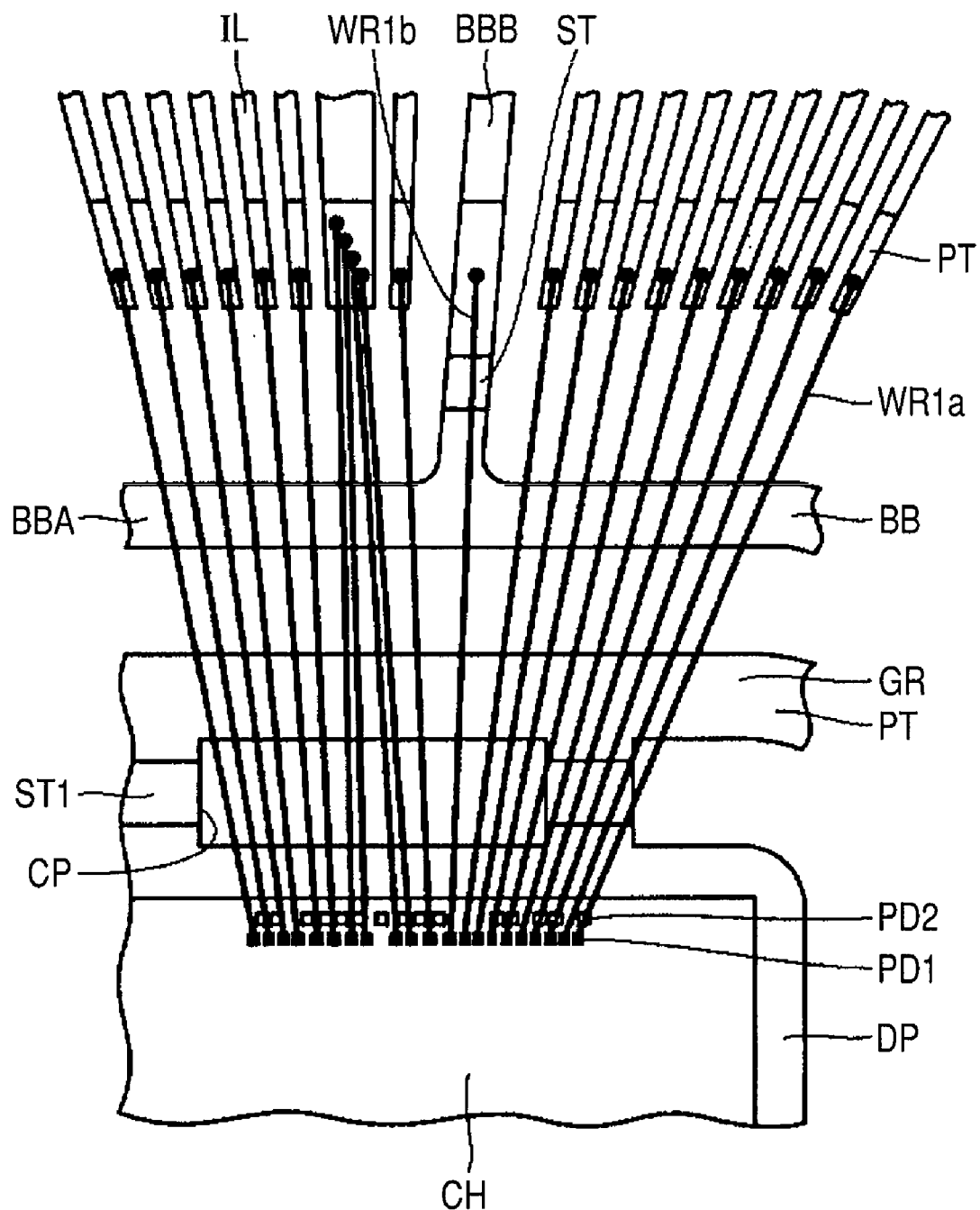
FIG. 18 is a schematic plan view of the configuration of a semiconductor device in a third embodiment of the invention, illustrating an area in proximity to a parallel running portion of the power supply bar in FIG. 4 in closeup.

FIG. 18 is a schematic plan view of the configuration of a semiconductor device in the third embodiment of the invention, illustrating an area in proximity to a parallel running portion of the power supply bar in FIG. 4 in closeup. In the configuration in this embodiment, as illustrated in FIG. 18, bonding wires WR1b are bonded not only to the jutted portion BBA of the power supply bar BB but also to a parallel running portion BBB. That is, a bonding wire WR1b is also bonded to a parallel running portion BBB sandwiched between two inner lead portions IL and extended in parallel with the adjoining inner lead portions.

In the description of this embodiment, the following case is taken as an example: a case where a bonding wire WR1b is bonded to the parallel running portion BBB coupled in the intermediate position, not at both ends, of the jutted portion BBA among the three parallel running portions BBB coupled to the jutted portion BBA. This bonding wire WR1b is bonded to the upper face of the parallel running portion BBB where the plating layer PL is formed. This bonding wire WR1b is bonded to a bonding pad PD1 on the inner radius side of a semiconductor chip CH.

Figure 19:
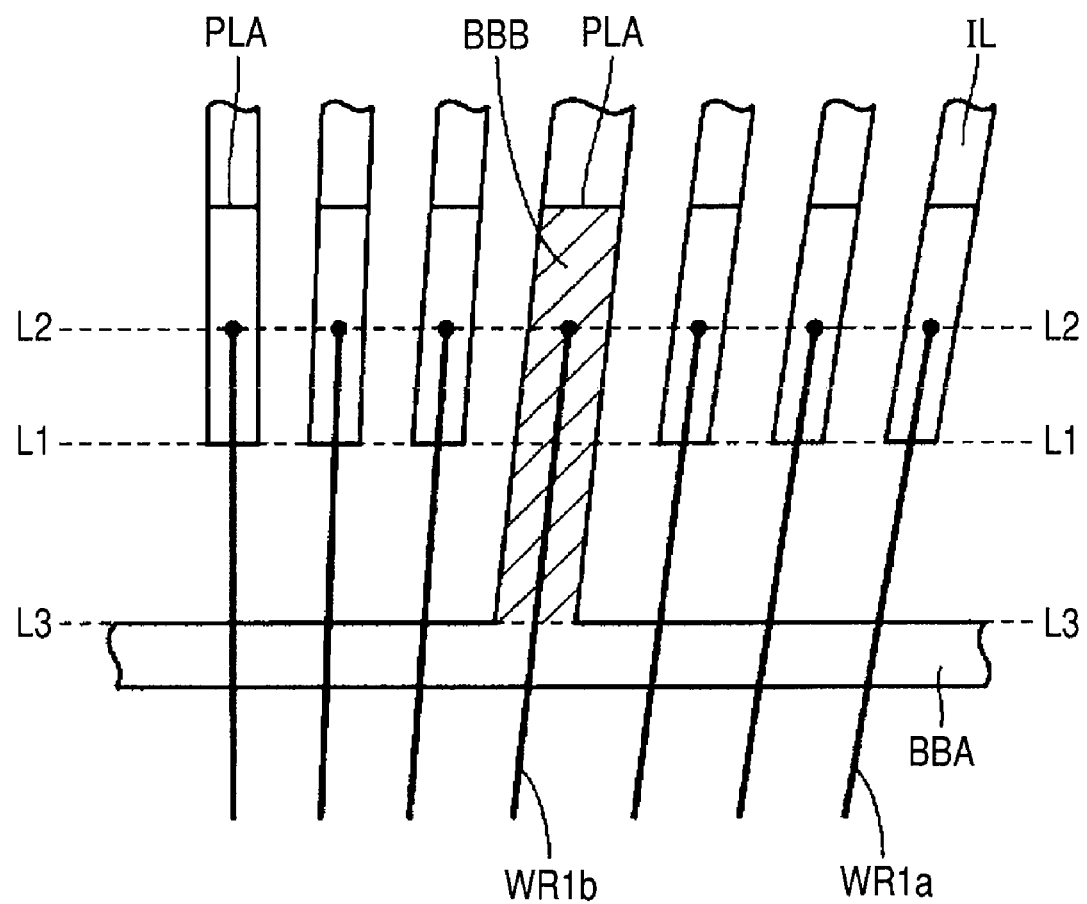
FIG. 19 is a schematic plan view explaining a parallel running portion with a jutted portion linearly extended.

Description will be given to a parallel running portion BBB of the power supply bar BB. FIG. 19 is a schematic plan view illustrating a parallel running portion with the jutted portion linearly extended. As illustrated in FIG. 19, the parallel running portion BBB is a portion extended in parallel with the inner lead portions IL adjoining thereto. When the jutted portion BBA is linearly extended as viewed on a plane, the parallel running portion BBB is equivalent to a portion obtained by removing the linear jutted portion BBA from the power supply bar BB. That is, a line obtained by imaginarily extending the visible outline L3-L3 of the linear jutted portion BBA on the parallel running portion BBB side as viewed on a plane into the power supply bar BB is the boundary line between the jutted portion BBA and the parallel running portion BBB. For this reason, the bonding wire WR1b is bonded to the following area (hatched area in the drawing): an area between the end (border line L3-L3) of the parallel running portion BBB on the jutted portion BBA side and an end PLA of the plating layer PL on the parallel running portion BBB.

It is desirable that the point on the parallel running portion BBB where the bonding wire WR1b is bonded should be positioned on the outer radius side relative to the tip of each inner lead portion IL. That is, it is desirable that the bonding wire WR1b should be bonded on the outer radius side relative to the imaginary straight line L1-L1 coupling the respective tips of inner lead portions IL arranged side by side.

Further, it is more desirable that the bonding wire WR1b should be bonded to the parallel running portion BBB on the imaginary straight line L2-L2 coupling the bonds of the bonding wires WR1a in the individual inner lead portions IL arranged side by side.

Figure 20:
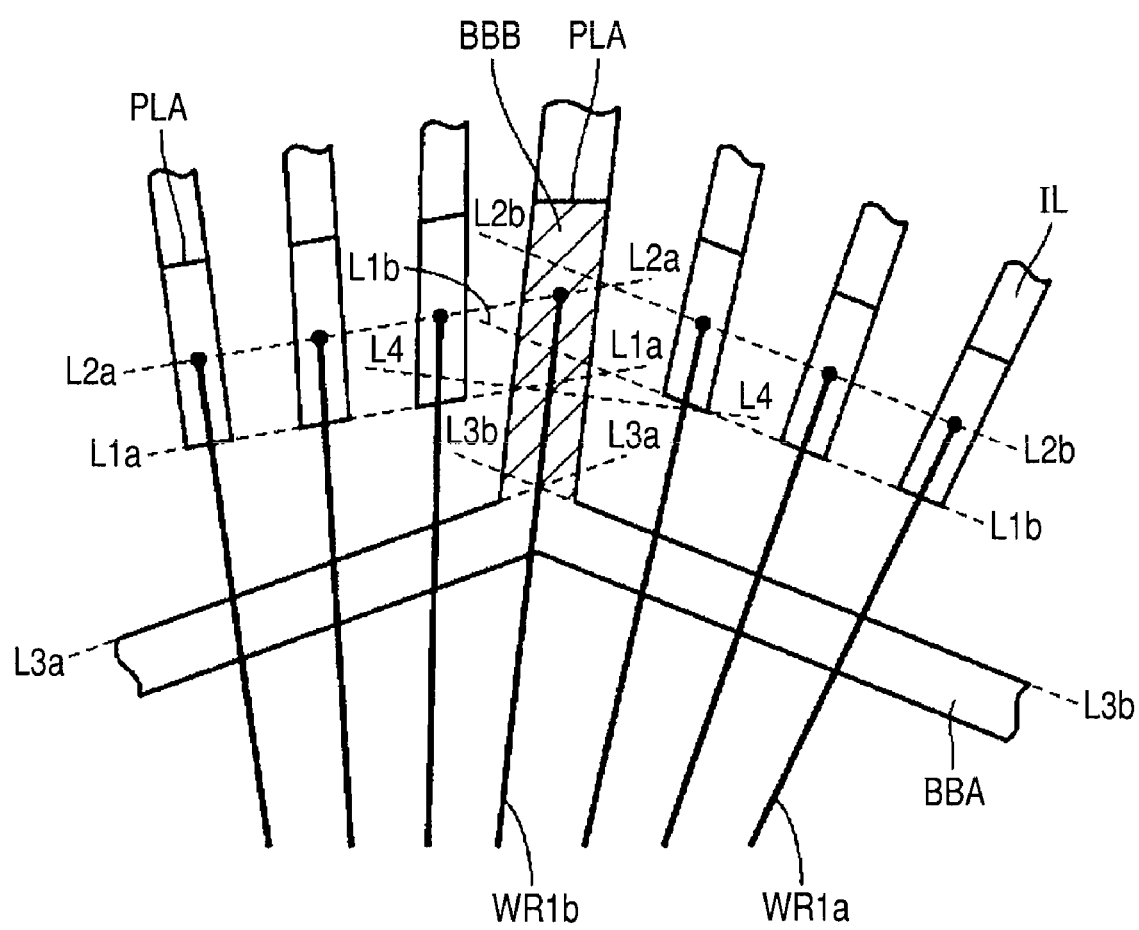
FIG. 20 is a schematic plan view explaining a parallel running portion with a jutted portion bent.

FIG. 20 is a schematic plan view explaining a parallel running portion with the jutted portion bent. When the jutted portion BBA is bent at a portion where it is coupled with the parallel running portion BBB as illustrated in FIG. 20, the parallel running portion BBB is equivalent to the following portion: a portion obtained by removing the bent jutted portion BBA from the power supply bar BB. That is, the following imaginary line is the border line between the jutted portion BBA and the parallel running portion BBB: an imaginary line obtained by imaginarily extending the visible outline L3a-L3a and the visible outline L3b-L3b of the bent jutted portion BBA on the parallel running portion BBB side as viewed on a plane into the power supply bar BB until they intersect each other. For this reason, the bonding wire WR1b is bonded to the following area (hatched area in the drawing): an area between the end (border lines L3a-L3a and L3b-L3b)

of the parallel running portion BBB on the jutted portion BBA side and an end PLA of the plating layer PL on the parallel running portion BBB.

Furthermore, it is desirable that a point on the parallel running portion BBB where the bonding wire WR1b is bonded should be positioned on the outer radius side relative to the tips of inner lead portions IL. That is, it is desirable that the bonding wire WR1b should be bonded on the outer radius side relative to the imaginary straight lines L1a-L1a and L1b-L1b coupling the tips of inner lead portions IL arranged side by side.

It is more desirable that a bonding wire WR1b should be bonded to the parallel running portion BBB on either of the following imaginary straight lines: an imaginary straight line L2a-L2a and an imaginary straight line L2b-L2b coupling the bonds of bonding wires WR1a in multiple inner lead portions IL arranged side by side.

It is more desirable that a bonding wire WR1b should be bonded to the parallel running portion BBB on the outer radius side relative to the following imaginary straight line: an imaginary straight line L4-L4 coupling the respective tips of the inner lead portions IL sandwiching the parallel running portion BBB therebetween.

The configuration of this embodiment is basically the same as the configuration of the first embodiment; therefore, description will not be repeated with respect to other than the foregoing.

Figure 21:
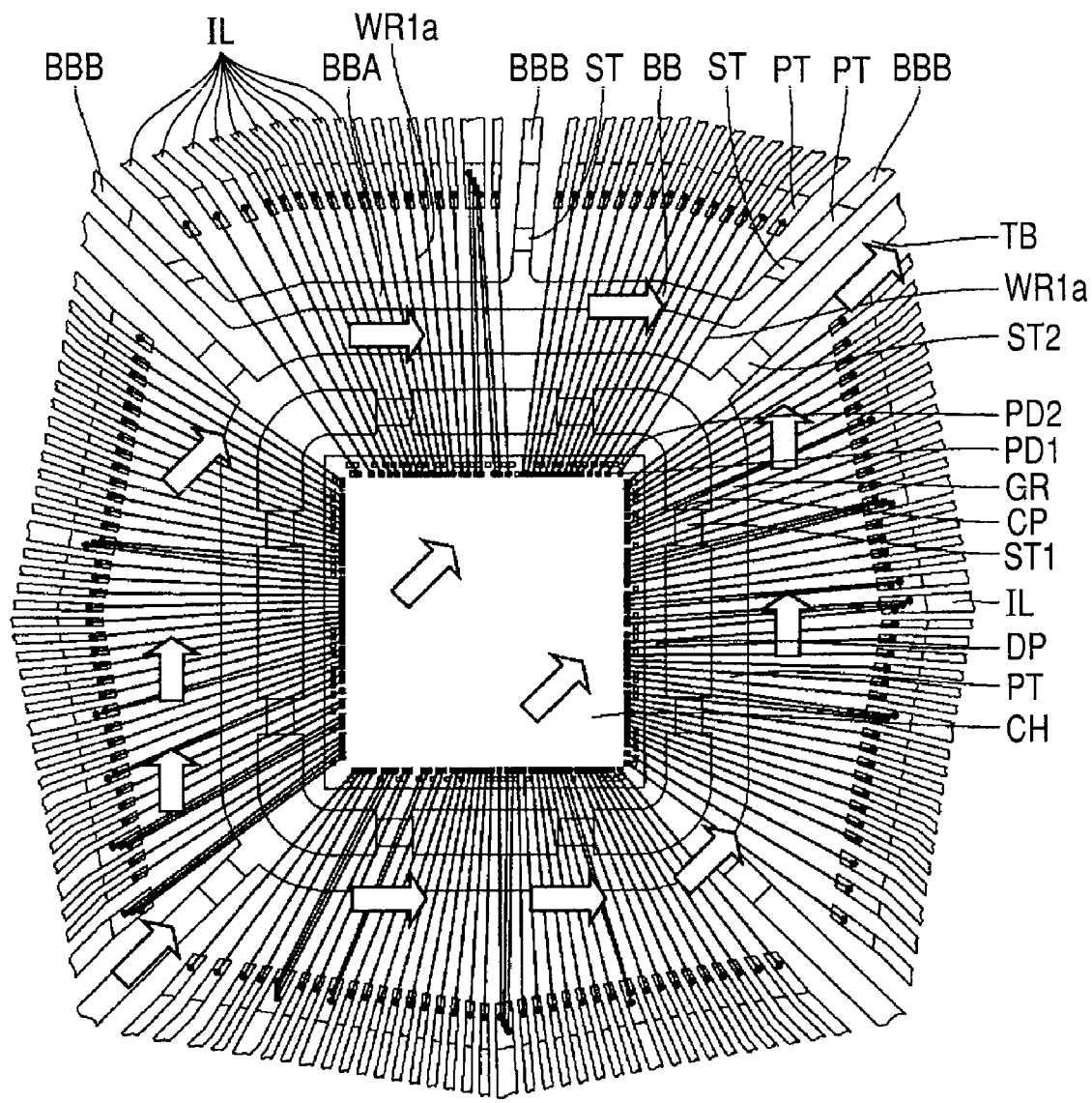
FIG. 21 is a plan view explaining how bonding wires flow during transfer molding.

Description will be given to the action and effect of this embodiment. First, the present inventors examined how bonding wires flowed during transfer molding. FIG. 21 is a plan view explaining how bonding wires flow during transfer molding. During transfer molding, as illustrated in FIG. 21, sealing resin moves from a gate as a sealing resin injecting portion to an air vent in the mold as indicated by arrows. With respect to the foregoing, the present inventors found the following: bonding wires are less prone to flow in areas where the bonding wires are arranged at equal intervals and prone to flow in areas where the bonding wires are not arranged at equal intervals. The present inventors also found the following: bonding wires are prone to flow in areas where the spacing between the bonding wires is large.

Figure 22:
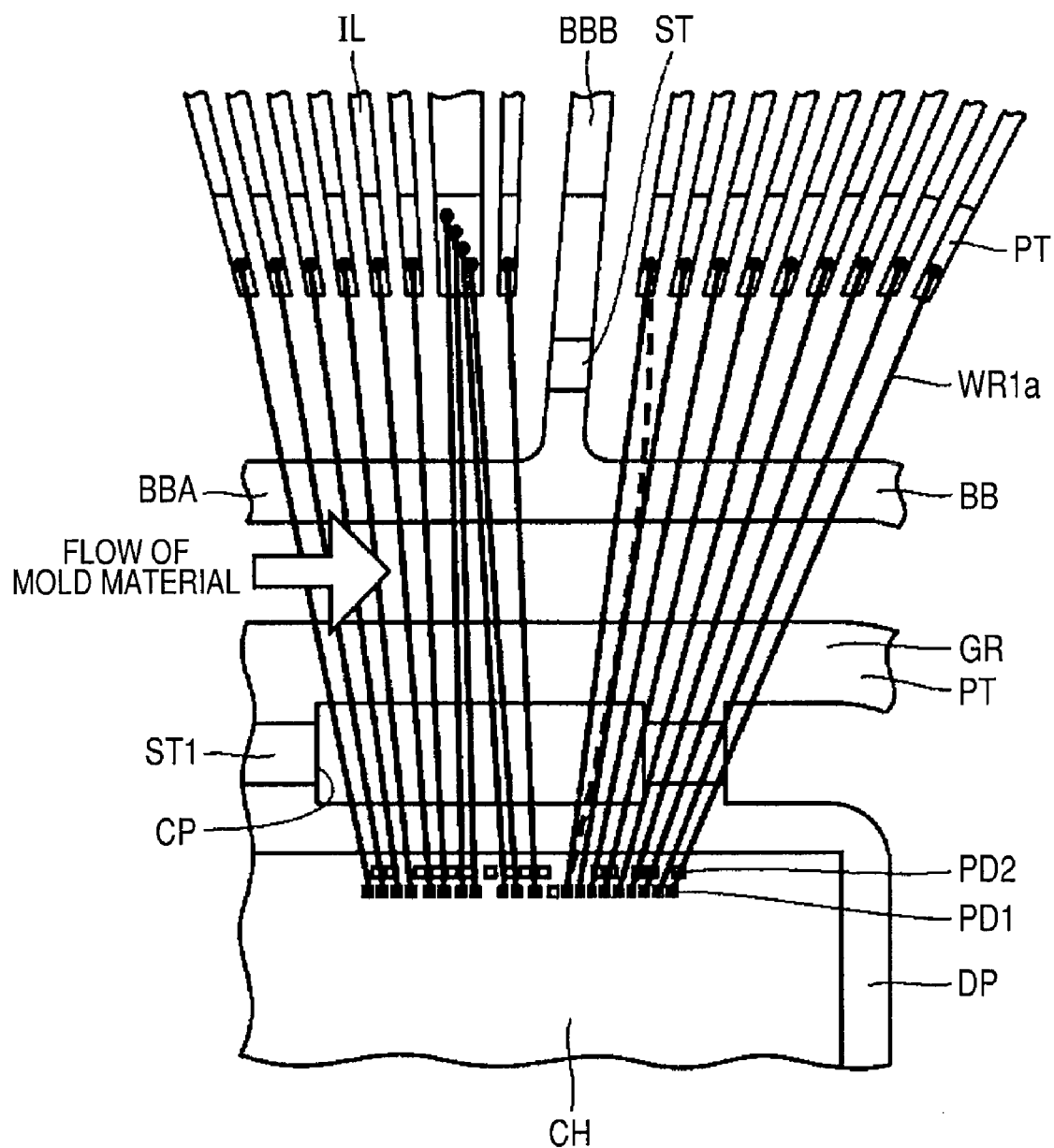
FIG. 22 is a schematic plan view explaining that bonding wires are prone to be short-circuited to one another when a bonding wire is not bonded to a parallel running portion sandwiched between inner lead portions.

For this reason, if a bonding wire is not bonded to a parallel running portion BBB sandwiched between inner lead portions IL as illustrated in FIG. 22, the following will take place: the spacing between the bonding wires WR1a sandwiching the parallel running portion BBB therebetween will become significantly larger than the spacing between the other bonding wires. For this reason, a bonding wire WR1a bonded to an inner lead portion IL adjoining to the parallel running portion BBB is prone to flow as indicated by broken line during transfer molding. As a result, bonding wires WR1a are prone to be electrically short-circuited to each other.

In this embodiment, a bonding wire WR1b is bonded to a parallel running portion BBB of the power supply bar BB as illustrated in FIG. 18 based on the above findings. This makes it possible to make the spacing between bonding wires in an area where they sandwich a parallel running portion BBB therebetween substantially equal to the spacing between bonding wires in the other areas. For this reason, it is possible to suppress bonding wires in proximity to a parallel running portion BBB from flowing during transfer molding and to prevent bonding wires from being electrically short-circuited to each other.

In the description of this embodiment, a case where a configuration in which a bonding wire WR1b is bonded to a parallel running portion BBB is applied to the configuration of the first embodiment has been taken as an example. However, the above configuration can also be applied to the configuration of the second embodiment. That is, also in the configuration of the second embodiment illustrated in FIG. 15, a bonding wire WR1b may be bonded to a parallel running portion BBB of the power supply bar BB sandwiched between inner lead portions IL.

Figure 23:
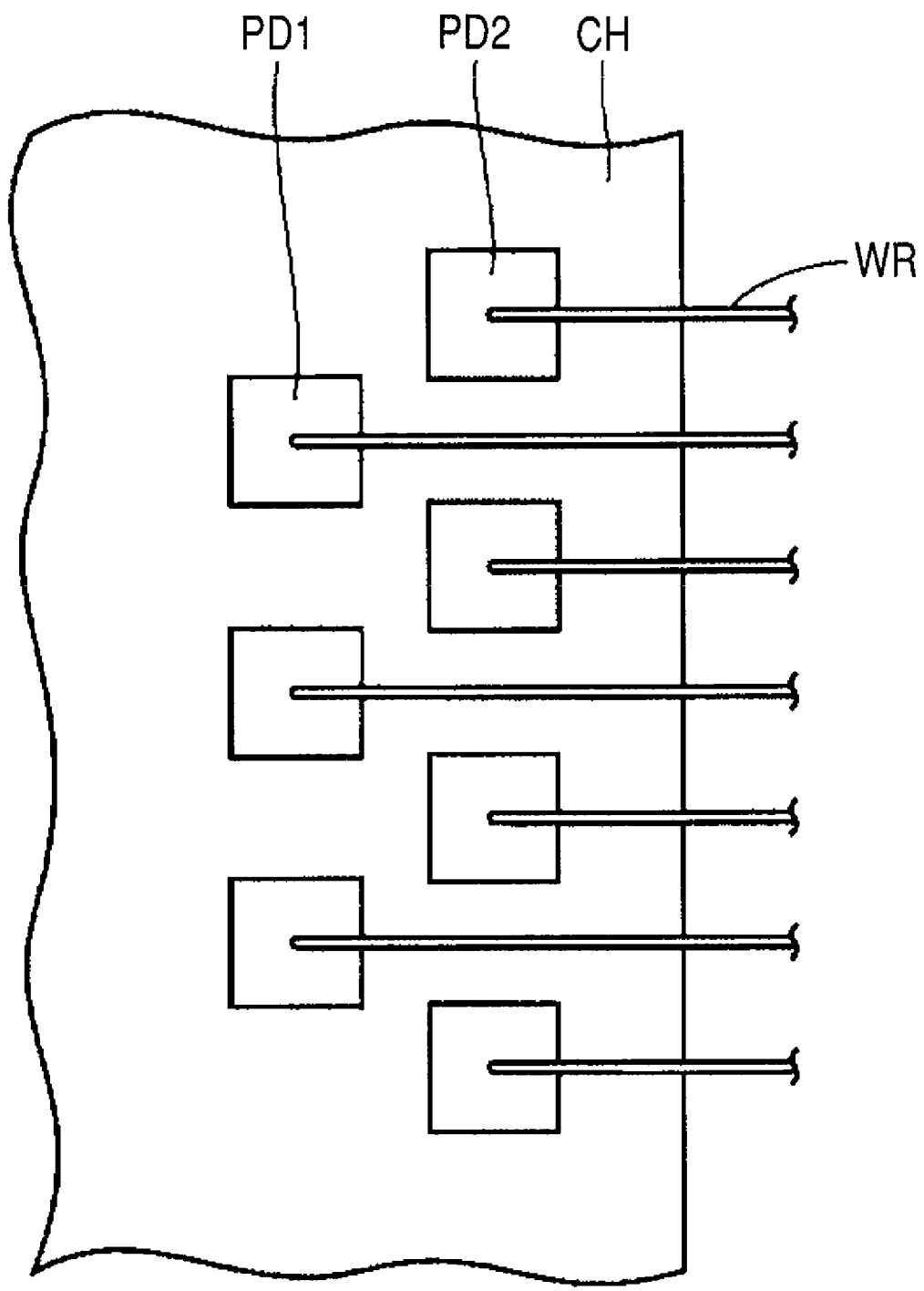
FIG. 23 is a partially enlarged plan view explaining the arrangement of bonding pads in the upper face of a semiconductor chip.

It is desirable that the bonding pads PD1, PD2 provided in the upper face of the semiconductor chip CH or CH2 in the first to third embodiments should be arranged in a staggered pattern as illustrated in FIG. 23.

The embodiments disclosed here are just examples in all respects and should not be considered to be limitative. The scope of the invention is indicated by WHAT IS CLAIMED IS, not by the above description and WHAT IS CLAIMED IS is intended to cover all the modifications within the spirit and scope equivalent thereto.

The invention is advantageously applicable to semiconductor devices having an inner lead portion electrically coupled with a semiconductor chip through a bonding wire and manufacturing methods therefor.

What is claimed is:

1. A semiconductor device comprising:
   a semiconductor chip;
   an inner lead portion having a tip arranged outside an outer circumferential end of the semiconductor chip as viewed on a plane;
   a power supply bar having a jutted portion extended between the outer circumferential end of the semiconductor chip and the tip of the inner lead portion as viewed on a plane; and
   a bonding wire electrically coupling the semiconductor chip and the inner lead portion with each other,
   wherein an upper face of the jutted portion of the power supply bar is in a position lower than an upper face of the tip of the inner lead portion,
   wherein the bonding wire has a bent portion positioned outside the outer circumferential end of the semiconductor chip as viewed on a plane,
   wherein the power supply bar has a parallel running portion extended in parallel with the inner lead portion with a gap in-between and a bent portion so bent that the upper face of the jutted portion is lower than an upper face of the parallel running portion, and
   wherein the bent portion is positioned on an inner radius side relative to the tip of the inner lead portion as viewed on a plane.

2. A semiconductor device comprising:
   a semiconductor chip;
   an inner lead portion having a tip arranged outside an outer circumferential end of the semiconductor chip as viewed on a plane;
   a power supply bar having a jutted portion extended between the outer circumferential end of the semiconductor chip and the tip of the inner lead portion as viewed on a plane; and
   a bonding wire electrically coupling the semiconductor chip and the inner lead portion with each other,
   wherein an upper face of the jutted portion of the power supply bar is in a position lower than an upper face of the tip of the inner lead portion,
   wherein the upper face of the tip of the inner lead portion is positioned at a height equal to or higher than a height position of an upper face of the semiconductor chip,
   wherein the power supply bar has a parallel running portion extended in parallel with the inner lead portion with a gap in-between and a bent portion so bent that the upper face of the jutted portion is lower than an upper face of the parallel running portion, and wherein the bent portion is positioned on an inner radius side relative to the tip of the inner lead portion as viewed on a plane.

3. A semiconductor device comprising:

a semiconductor chip;

an inner lead portion having a tip arranged outside an outer circumferential end of the semiconductor chip as viewed on a plane;

a power supply bar having a jutted portion extended between the outer circumferential end of the semiconductor chip and the tip of the inner lead portion as viewed on a plane; and a bonding wire electrically coupling the semiconductor chip and the inner lead portion with each other, wherein an upper face of the jutted portion of the power supply bar is in a position lower than an upper face of the tip of the inner lead portion, wherein the bonding wire has a bent portion positioned outside the outer circumferential end of the semiconductor chip as viewed on a plane, wherein the power supply bar has a parallel running portion extended in parallel with the inner lead portion with a gap in-between and a bent portion so bent that the upper face of the jutted portion is lower than an upper face of the parallel running portion, and wherein the bent portion is positioned on an outer radius side relative to the tip of the inner lead portion as viewed on a plane.

4. A semiconductor device comprising:

a semiconductor chip;

an inner lead portion having a tip arranged outside an outer circumferential end of the semiconductor chip as viewed on a plane;

a power supply bar having a jutted portion extended between the outer circumferential end of the semiconductor chip and the tip of the inner lead portion as viewed on a plane; and a bonding wire electrically coupling the semiconductor chip and the inner lead portion with each other, wherein an upper face of the jutted portion of the power supply bar is in a position lower than an upper face of the tip of the inner lead portion, wherein the upper face of the tip of the inner lead portion is positioned at a height equal to or higher than a height position of an upper face of the semiconductor chip, wherein the power supply bar has a parallel running portion extended in parallel with the inner lead portion with a gap in-between and a bent portion so bent that the upper face of the jutted portion is lower than an upper face of the parallel running portion, and wherein the bent portion is positioned on an outer radius side relative to the tip of the inner lead portion as viewed on a plane.

* * * * *